(12) United States Patent
Ho et al.

(10) Patent No.: US 6,683,781 B2
(45) Date of Patent: Jan. 27, 2004

(54) PACKAGING STRUCTURE WITH LOW SWITCHING NOISES

(75) Inventors: Ted C. Ho, Hsinchu (TW); Min-Lin Lee, Hsinchu (TW); Huey-Ru Chang, Hsinchu (TW); Shinn-Juh Lay, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 10/152,669

(22) Filed: May 23, 2002

(65) Prior Publication Data

US 2003/0217858 A1 Nov. 27, 2003

(51) Int. Cl.[7] .................................. H01G 4/00
(52) U.S. Cl. .................... 361/301.1; 361/766; 361/821; 361/306.3
(58) Field of Search .............................. 361/301.1, 766, 361/782, 821, 301.4, 306.1, 306.3, 312, 313, 765; 174/52.1, 52.4; 257/528–533, 535–537, 541, 543

(56) References Cited

U.S. PATENT DOCUMENTS

| | | | | |
|---|---|---|---|---|
| 4,451,845 A | * | 5/1984 | Philofsky et al. | 257/703 |
| 4,454,529 A | * | 6/1984 | Philofsky et al. | 257/684 |
| 5,633,785 A | | 5/1997 | Parker et al. | |
| 5,982,018 A | * | 11/1999 | Wark et al. | 257/532 |
| 6,054,754 A | * | 4/2000 | Bissey | 257/666 |

* cited by examiner

*Primary Examiner*—Anthony Dinkins
(74) *Attorney, Agent, or Firm*—Birch, Stewart, Kolasch & Birch, LLP

(57) ABSTRACT

A packaging structure with low switching noises is disclosed. In this structure, a chip capacitor is connected to a chip. The chip capacitor is a capacitor structure formed using a high dielectric material to provide a better noise filtering effect. Therefore, the invention can effectively lower switching noises.

20 Claims, 12 Drawing Sheets

PACKAGING STRUCTURE WITH LOW SWITCHING NOISES

BACKGROUND OF THE INVENTION

1. Field of Invention

The invention relates to a packaging structure used in IC (integrated circuit) chip packaging. In particular, it relates to a packaging structure with low switching noises.

2. Related Art

To meet the high frequency and high-speed demands for high-tech products, the rise time of a circuit system becomes even faster. At the same time, this makes the timing budget and noise margin tighter than ever. In addition to device selections, the system stability has definite influence on noise immunity of the circuit. The three major subjects in noise suppression are reflection noises, coupled noises, and switching noises.

Impedance matching is important for the reflection noises. For the coupled noises, it is essential to notice the control of the distance and length of parallel wires. The switching noises or SSN's (simultaneous switching noise) generated when a high speed IC turns on and off and requires a tremendous amount of decoupling capacitors or bypass capacitors to stabilize the power supply and to filter high-frequency noises.

However, many capacitor elements are not compact and light enough for most of modern electronics. Furthermore, the longer a circuit loop is the more noises there are. Therefore, these capacitors have to be within a fixed distance from the IC (the faster the rise time is, the shorter the distance is required). That is, even if the substrate area is enlarged to accommodate more capacitors, it is still possible that the distance is too far to achieve expected effects. This is a problem for circuit designers.

Although the packaging sizes of passive components become smaller, SMD's (surface mount device) changes from 1210→1206→0805→0603→0402 to even 0201. Nevertheless, as the area gets smaller, possible capacitance also gets smaller. It is not easy to package a capacitor with a large capacitance into s small size. Moreover, it is not only complex to design a layout with many capacitor elements on a substrate, the small elements also cause great difficulty in surface bonding processes.

Nowadays, it is still hard to minimize independent capacitors with larger capacitance. As mentioned in the previous paragraph, the surface bonding process in this case is also difficult. Since large capacitance requires a large area of conductive plane; therefore, if the capacitor is integrated into the design of an IC wafer, it must occupy a large area on the wafer. This is very uneconomical. However, for higher and higher work frequencies, it will be even more difficult to restrain switching noises within an acceptable range if no capacitors with appropriate capacitance and number can be provided to IC's.

To minimize the area occupied by passive components, a current method is to use embedded passive components. Although the built-in-substrate technique of using embedded capacitors in an organic substrate can achieve the high-density objective, the organic substrate has to use other high dielectric constant material. This specially prepared substrate does not only cost higher due to its complicated circuit board, the circuit layout is also very difficult. Since the dielectric constant of the material affects the area occupied by the embedded capacitors (i.e. the area has to be increased if the dielectric constant is not high enough), the area is often too big to be practical. (Ceramic substrates have a dielectric constant of about 9.5 and the commonly seen FR-4 has a dielectric constant of 4.7. To make the products more practical, the dielectric constant has to be more than 100.) Furthermore, most of the system substrates adopt cheap and widely used organic substrates (such as FR-4). However, materials compatible with organic substrates and dielectric constants high enough to be used as capacitors are still under development. The above-mentioned problems are the bottleneck of current embedded capacitor technique for organic substrates.

To solve these problems, some solutions had been proposed in the prior art. For example, the U.S. Pat. No. 5,633,785 utilizes an interconnect substrate with resistance, capacitance and inductance effects. The interconnect substrate is connected with a chip by wire bonding. The substrate is divided into an array of a plurality of blocks. Each block contains a passive component that can generate resistance, capacitance and inductance effects. Traces are used to connect each block to a bond pad outside the array. Although this provides a high-efficiency and high-density IC packaging method, the traces will generate unnecessary inductance effects to lower the quality of the circuit. Moreover, the design varies for different chip sizes and pin assignments. Therefore, it is very uneconomical.

SUMMARY OF THE INVENTION

In view of the foregoing, the invention provides a packaging structure with low switching noises. In this structure, a chip capacitor is directly connected to the chip, removing discrete SMT(surface mount technology) capacitor component and subsequent processing. The chip capacitor can be closer to the chip, providing better noise filtering effects. Since the chip capacitor and the chip are stacked together, the chip capacitor does not occupy extra area as independent capacitors. Moreover, the chip capacitor can have different capacitance values to satisfy different needs in circuits, so they are not restricted to any particular chip.

The disclosed packaging structure with low switching noises includes an IC chip and a chip capacitor. The chip capacitor is a capacitor structure with a plurality of electrode layers and insulation materials that have high dielectric constant. Each electrode layer has an I/O connect pad connecting to a top layer. The I/O connect pads of electrodes with different potentials are separate. The chip capacitor is then connected to a top surface or a back surface of the chip. The connection of the I/O connect pad on the IC chip and the chip capacitor is achieved through wire bonding, bumps, side conductors, pads or conductive through holes. The connection with the substrate is the same.

The I/O connect pad is an I/O bonding pad. Its shape can be a hexagon hive or other geometric patterns such as circles and quadrilateral. The I/O bonding pads of different electrode layers are arranged in an interposed way. This configuration provides a universal capacitor for all kinds of IC chips. The I/O connect pad can also be designed to surround the border of the top layer of the capacitor. Since it is a large-area contact, such a configuration an lower possibly unnecessary inductance effects.

BRIEF DESCRIPTION OF THE DRAWINGS

The invention will become more fully understood from the detailed description given hereinbelow illustration only, and thus are not limitative of the present invention, and wherein.

DETAILED DESCRIPTION OF THE INVENTION

Figure 1A:
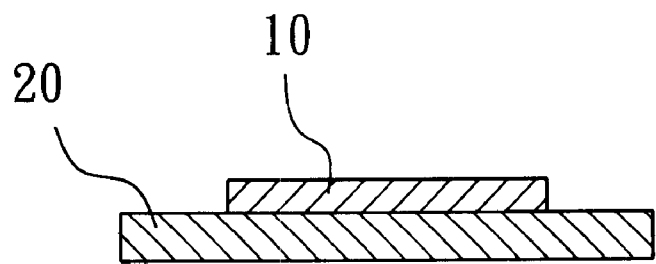
FIGS. 1A and 1B are schematic views of the invention.
Figure 1B:
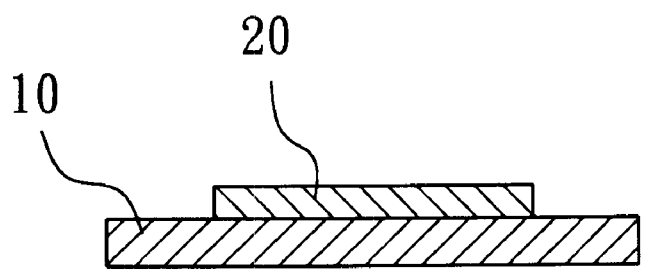

According to the disclosed packaging structure with low switching noises, the capacitor is made into a thin sheet (chip capacitor). The chip capacitor is bonded to an IC chip or a substrate in practice. It can be attached to either the top or the bottom surface of the IC chip 20, as shown in FIGS. 1A and 1B. In addition to the advantage of getting closer to the IC chip than the embedded capacitor substrate to provide better switching noise suppression abilities, the invention does not need to use expensive substrates requiring special materials and manufacturing processes. In practice, there are four types of chip capacitors. One is an independent chip capacitor 10 that can be attached to the top or bottom of the IC chip 20 (FIGS. 2A through 2D and 2G). The IC chip 20 and the chip capacitor 10 can be connected to a substrate 30 directly or using solder balls 52. The connecting points on the chip capacitor 10, the IC chip 20 and the substrate 30 are connected by wire bonding 40. Afterwards, the substrate 30 is attached to a designated place using solder balls or other methods as well.

Figure 2A:
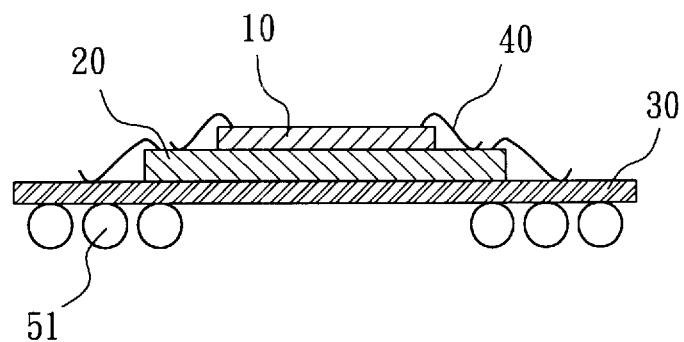
FIGS. 2A through 2I are schematic views showing the applications of the invention.
Figure 2B:
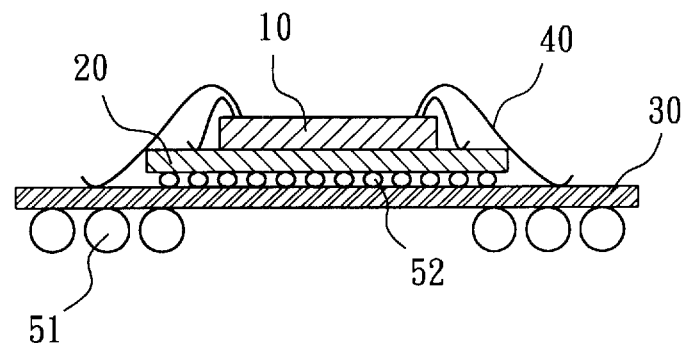
Figure 2C:
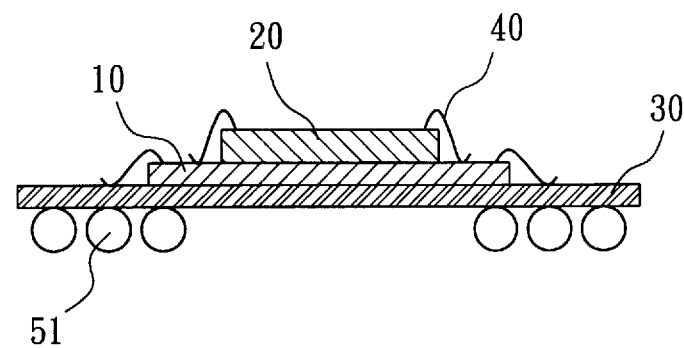
Figure 2D:
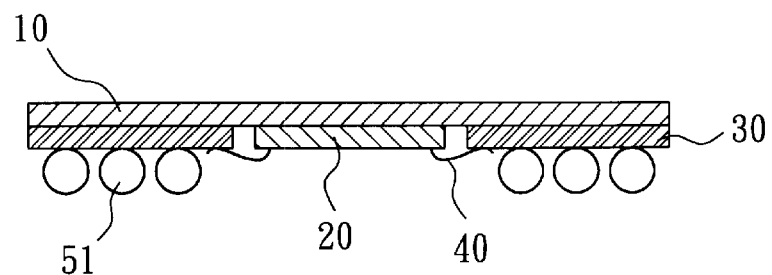
Figure 2E:
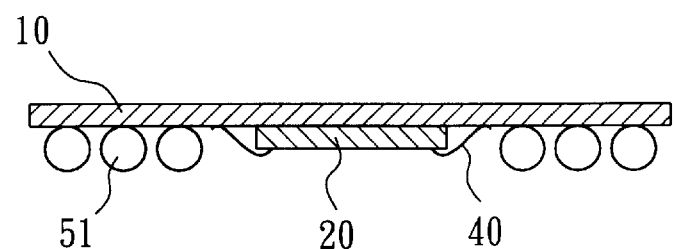
Figure 2F:
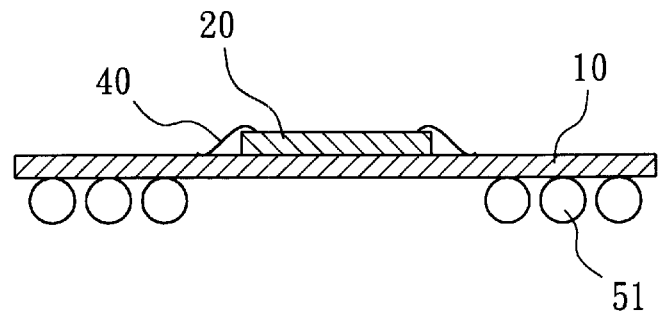
Figure 2G:
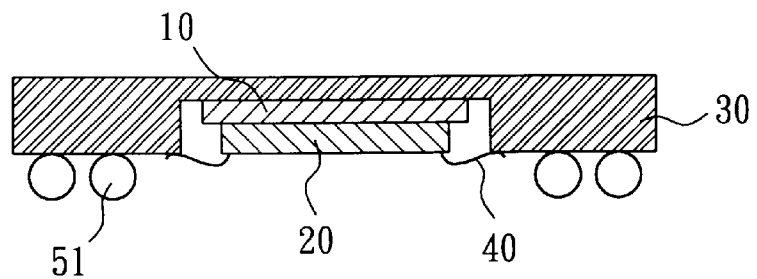
Figure 2H:
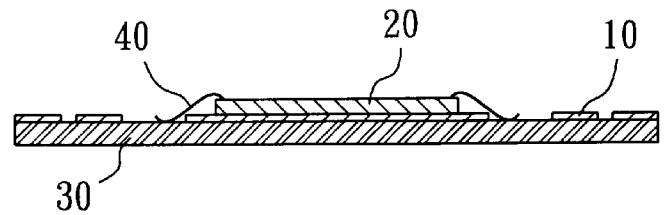
Figure 2I:
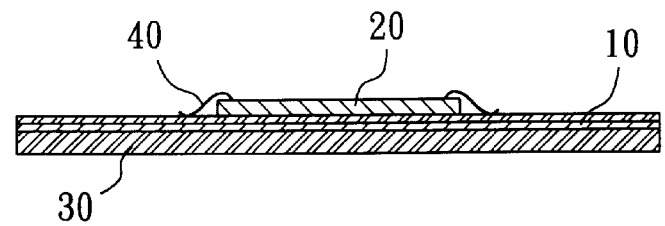
Figure 3A:
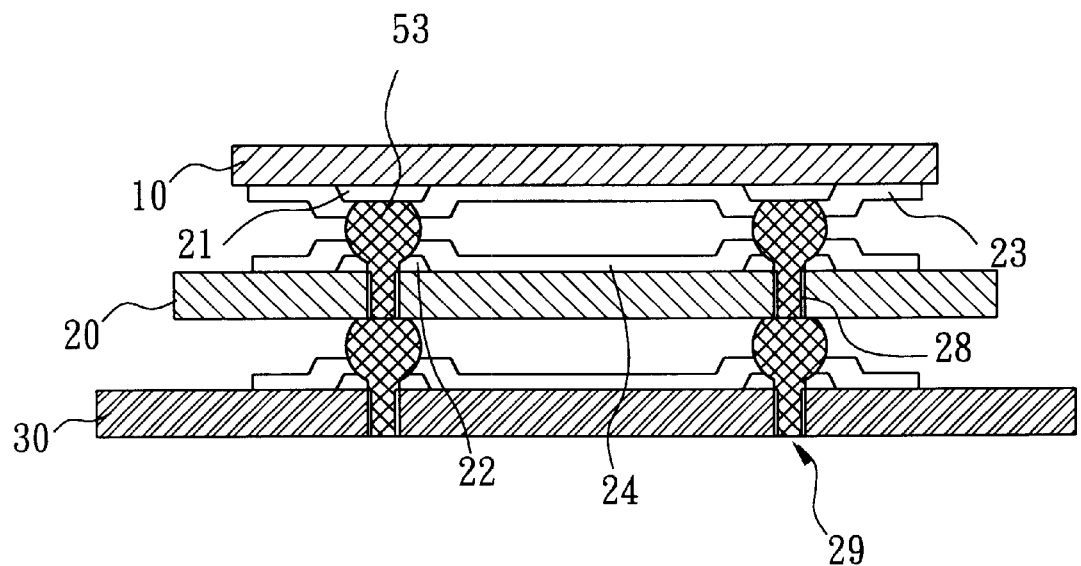
FIGS. 3A and 3B are schematic view of the bonding.

The second case is that the IC component or chip can directly use a chip capacitor with a reserved circuit as its IC substrate. With reference to FIGS. 2E and 2F, the chip capacitor 10 is the IC substrate of the IC chip 20 for holding the IC chip 20 thereon. The third case is to directly attach a chip capacitor made by a thick/thin film process directly onto a circuit substrate, as shown in FIG. 2H. The fourth one is to embed a whole chip capacitor 10 into a circuit substrate 30, as in FIG. 2I. The connections among the IC chip 20, the chip capacitor 10, and the substrate 30 are not limited to the wire bonding method mentioned before. The connections can be achieved by bonding material or bumping as well. As shown in FIG. 3A, the IC chip 20 has an I/O bonding pad 22 with internal connections. The I/O bonding pad 22 is formed with a protective insulate layer 24, which only exposes partial surface of the I/O bonding pad 22. Afterwards, a laser drilling or micro-electro-machinery process forms holes 29 through each I/O bonding, pad 22 and each chip 20. After the holes 29 are formed on the chip 20, a barrier layer 28 has to be formed at the surface of each hole 29 to avoid short circuits from happening. The chip 20 is then aligned with a provided chip capacitor 10. The chip capacitor 10 is formed with an I/O bonding pad 21 as an I/O connecting point of the circuit. Similarly, a bond mask 23 is provided on the I/O bonding pad 21. The IC chip 20 faces down (or up), with its holes 29 in line with the I/O bonding pad 21 on the chip capacitor 10. A solder jetting or printing procedure is then employed to put a bonding material between the chip capacitor 10 and the IC chip 20 through the holes 29, so that the I/O bonding pads 21, 22 of the chip capacitor 10 and the IC chip 20 are in electrical communications through the bonding material. Finally, a reflow process uses a temperature higher than the melting point of the bonding material to heat up the bonding material, changing the bonding material from solid to liquid. During the cooling process, the bonding material forms a preferable bonding bump 53 connecting the chip capacitor 10 and the IC chip 20 due to its internal force. The substrate 30 is then stacked onto the chip 20 by repeating the above steps.

Figure 3B:
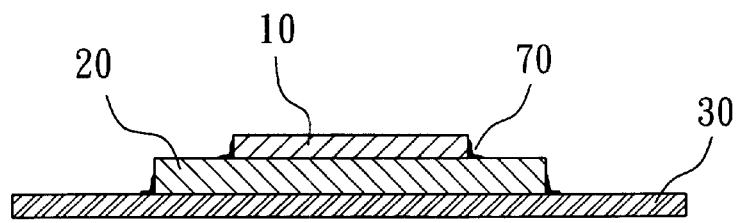

On the other hand, as shown in FIG. 3B, a side connection may be employed to apply solder on the I/O bonding pad by solder jetting, printing or pre-applied solder paste. After a reflow step, a side connection conductor 70 is formed to connect the chip capacitor 10, the IC chip 20 and the substrate 30. The bond wiring is taken as an example to be further explained in the following paragraph.

Figure 4A:
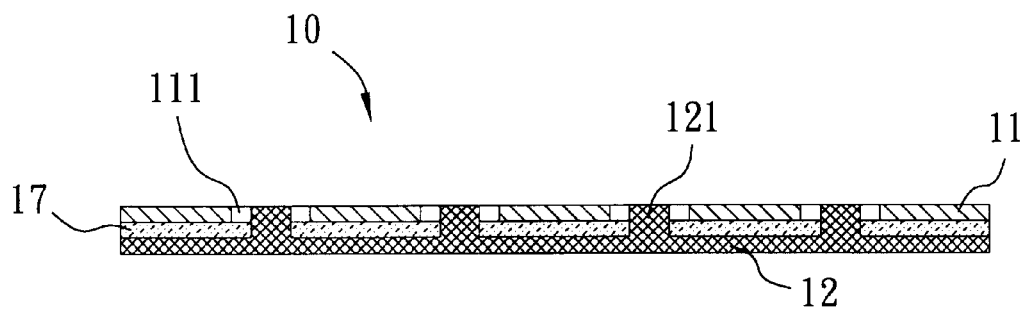
FIGS. 4A and 4B show a first embodiment of the disclosed chip capacitor.
Figure 4B:
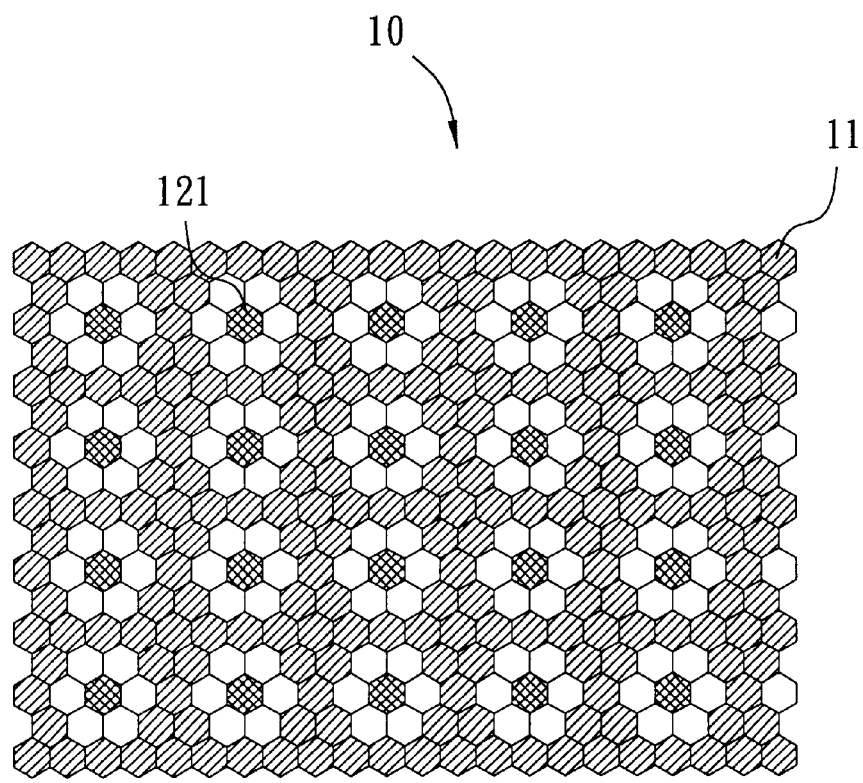

The chip capacitor 10 has roughly a thin sheet shape, as shown in FIG. 4A. It has a first electrode layer 11 and a second electrode layer 12. A high dielectric constant (Dk.) material 17 separates the two electrode layers. The two electrode layers 11, 12 are conductive to form a capacitor. The second electrode layer 12 has an I/O connect pad 121 connecting to a top layer. The I/O connect pad 121 is not only the bonding pad of the top layer, but also provide conductive through holes. An insulate part 111 is provided around the I/O connect pad 121 to avoid direct contact between the first electrode layer 11 and the second electrode layer 12. The I/O connect pads 121 are disposed in an array, as shown in FIG. 4B, so that the bonding pad 201 at any position on the chip 20 can find a corresponding power source block for connection within a short distance. It is a universal design so that one the invention does not need to be designed or prepared specifically for any particular IC chip.

Figure 5:
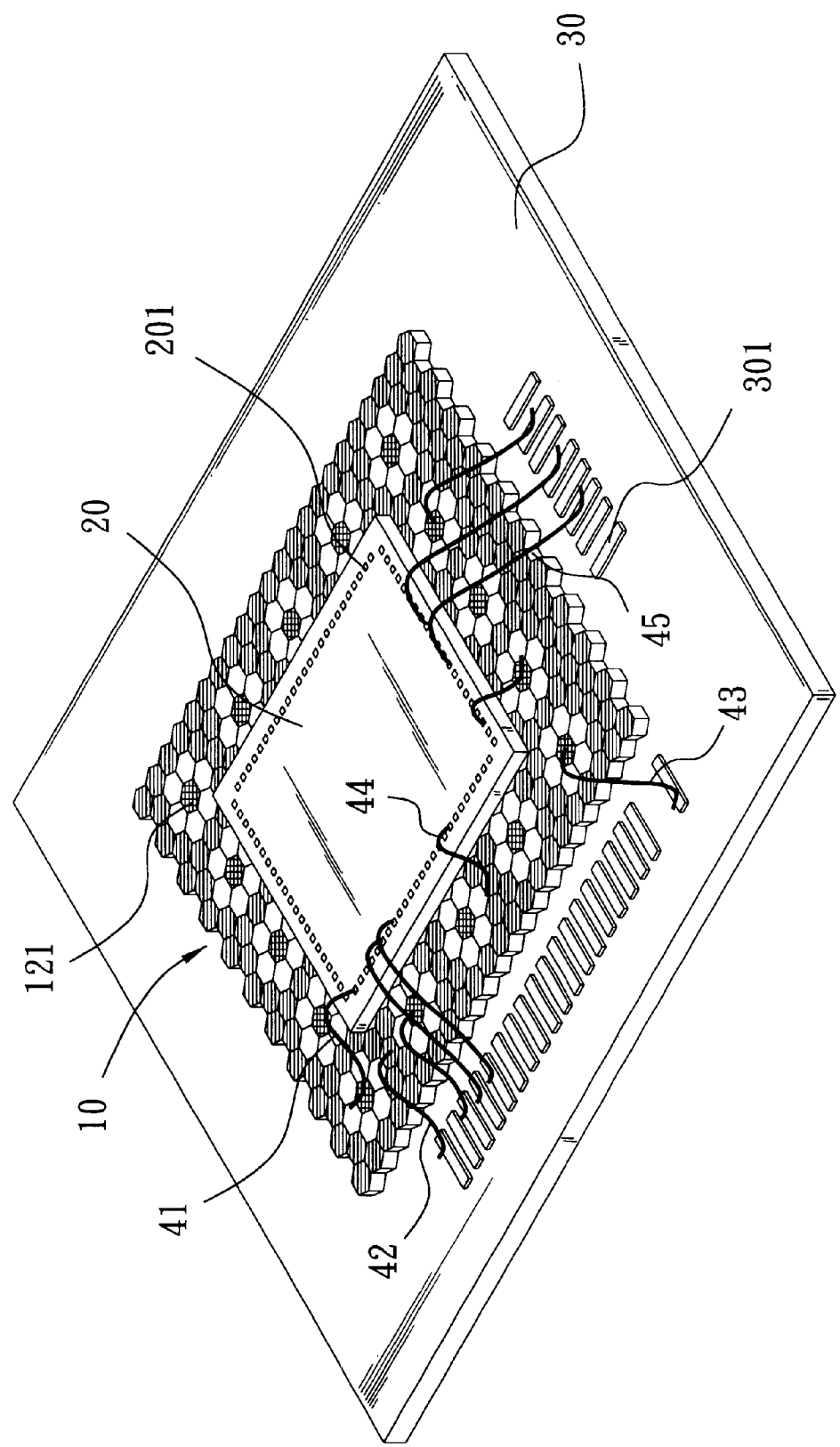
FIG. 5 schematically shows the first embodiment.

As shown in FIG. 5, an IC chip 20 is bonded onto a chip capacitor 10 and both of them are connected to a substrate 30. The bonding pad 201 on the IC chip 20 can be connected to the top surface of the first electrode layer 11 through wire bonding 44, to the I/O connect pad 121 on the second electrode layer 12 through wire bonding 41, or even to the bonding finger 301 on the substrate 30 through wire bonding 45. Similarly, the first electrode layer 11, the second electrode layer 12 and the bonding finger 301 of the substrate 30 can be connected through wire bonding 42, 43 if necessary. Such a two-layer electrode layer design combines a power layer and a ground layer. That is to say, the chip capacitor 10 provides a universal design. The IC chip 20 and the substrate 30 can find a nearest connection part on the chip capacitor 10 according to the needs.

Figure 6B:
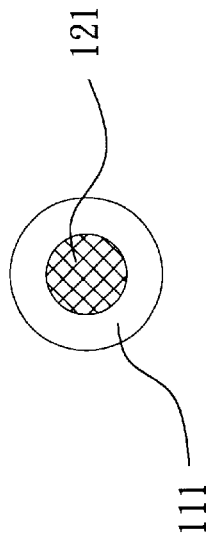
FIGS. 6A through 6D show an embodiment of the disclosed I/O bonding pad.
Figure 6D:
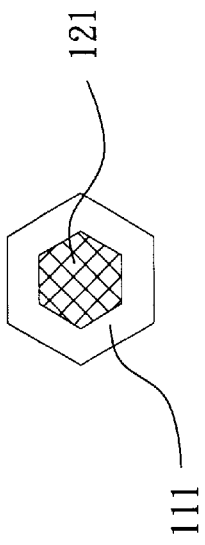
Figure 6A:
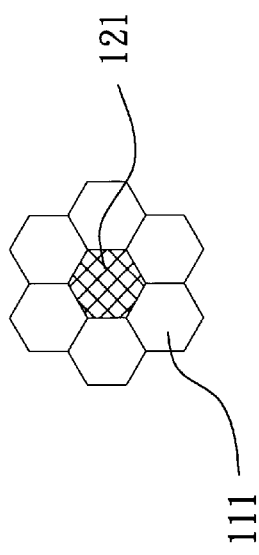
Figure 6C:
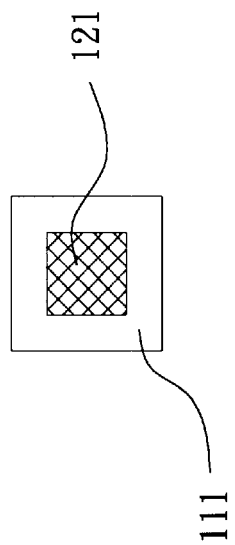

In particular, the I/O connect pads 121 and the surrounding insulate part 111 form a hive structure (FIG. 6A), or geometrical patterns of circles (FIG. 6B), squares (FIG. 6C) and hexagons (FIG. 6D), etc. The manufacturing of the chip capacitor 10 may use the ceramic substrate processing or circuit board processing that is well known to the field. The insulate part 111 can be empty or filled with insulate materials.

Figure 7:
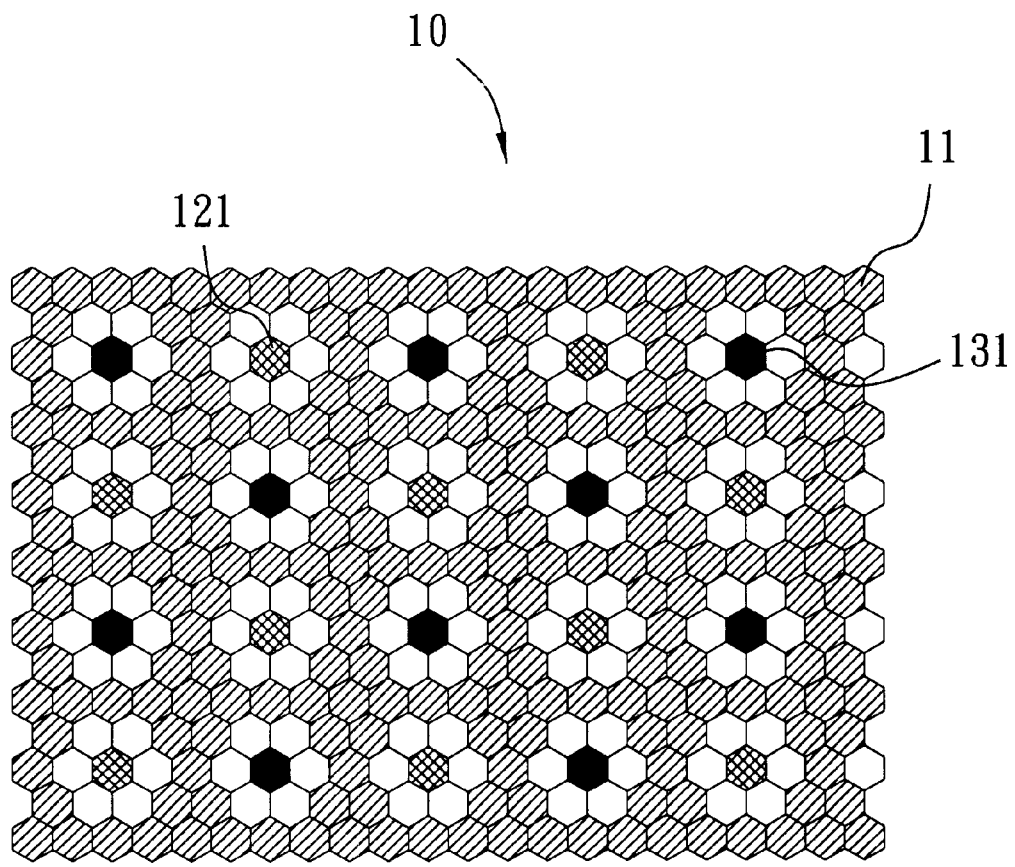
FIG. 7 is a schematic view of a second embodiment of the disclosed chip capacitor.
Figure 8A:
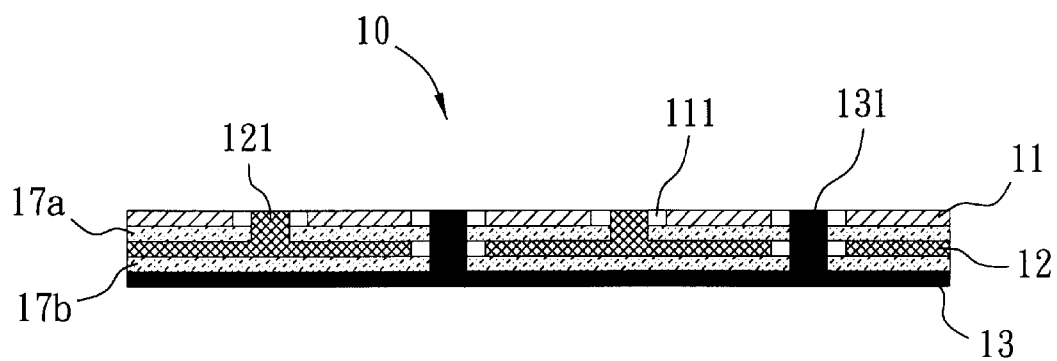
FIGS. 8A and 8B are cross-sectional views of FIG. 7.

Aside from the above-mentioned double-layer electrode design, other electrode layer designs can be used for different circuit and material properties. If the IC chip 20 needs two bypass capacitors using different power supplies, then the chip capacitor 10 can be designed to have three electrode layers. Both the second electrode layer 12 and the third electrode layer 13 have I/O connect pads 121, 131 connecting to the top layer and separated from the first electrode layer 11, as shown in FIG. 7. The structure may be three layers of isolated electrode layers, as in FIG. 8A. That is, the first electrode layer 11, the second electrode layer 12, and the third electrode layer 13 are separated by high Dk. Materials 17a, 17b. Similarly, the second electrode layer 12 and the third electrode layer 13 have interposed I/O connect pads 121, 131 connecting to the first electrode layer 11. These three electrode layers can be, respectively, a ground layer, a first power layer and a second power layer.

Figure 8B:
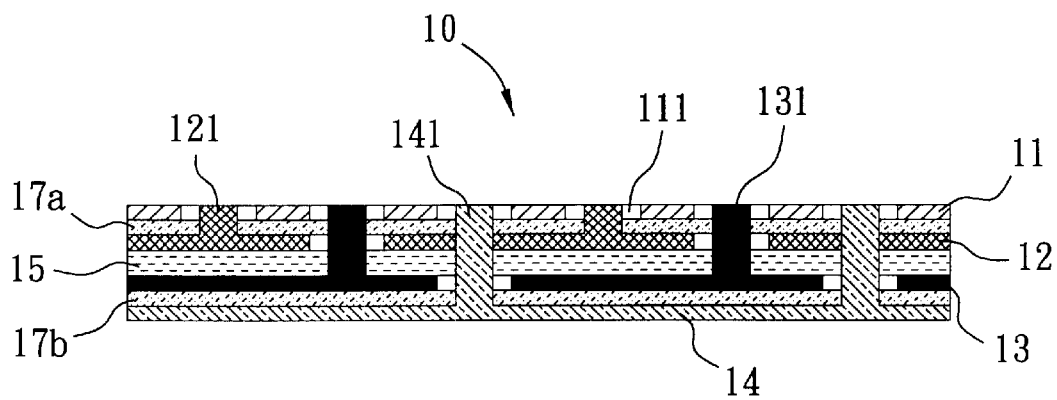

On the other hand, as shown in FIG. 8B, one can use the design with four electrode layers 11, 12, 13, 14. The first electrode layer 11 and the second electrode layer 12 is separated by a high Dk. material 17a; and the third electrode layer 13 and the fourth electrode layer 14 are separated y a high Dk. material 17b. The second electrode layer 12 and the third electrode layer 13 are separated by a dielectric material 15. The second electrode layer 12 and the fourth electrode layer 14 are connected, thus providing a ground layer and forming a double potential chip capacitor 10. As in the previous case, each electrode layer 12, 13, 14 has an I/O connect pad 121, 131, 141, respectively, connecting to the top layer while isolated from the first electrode layer 11. Chip capacitors 10 with three or more potentials can be analogously prepared according to different needs.

Figure 9B:
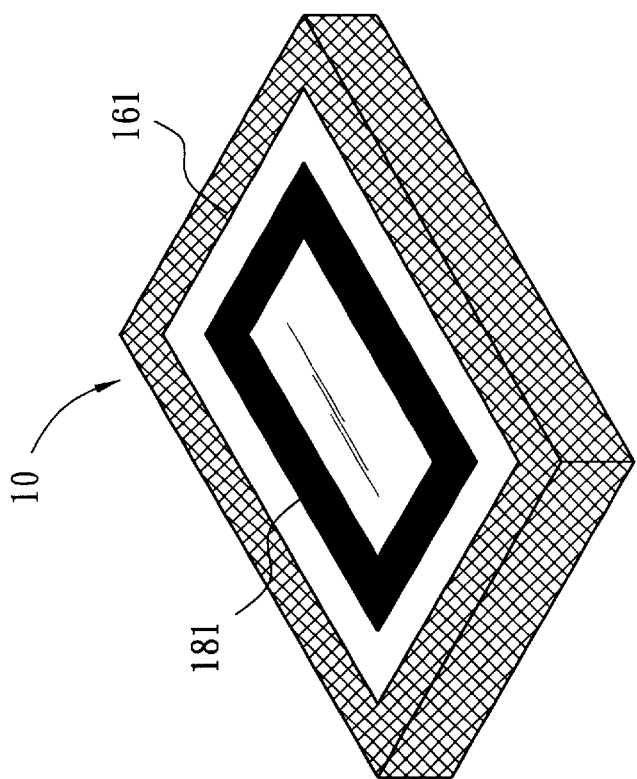
FIGS. 9A through 9D are schematic views of a third embodiment of the disclosed chip capacitor.
Figure 9A:
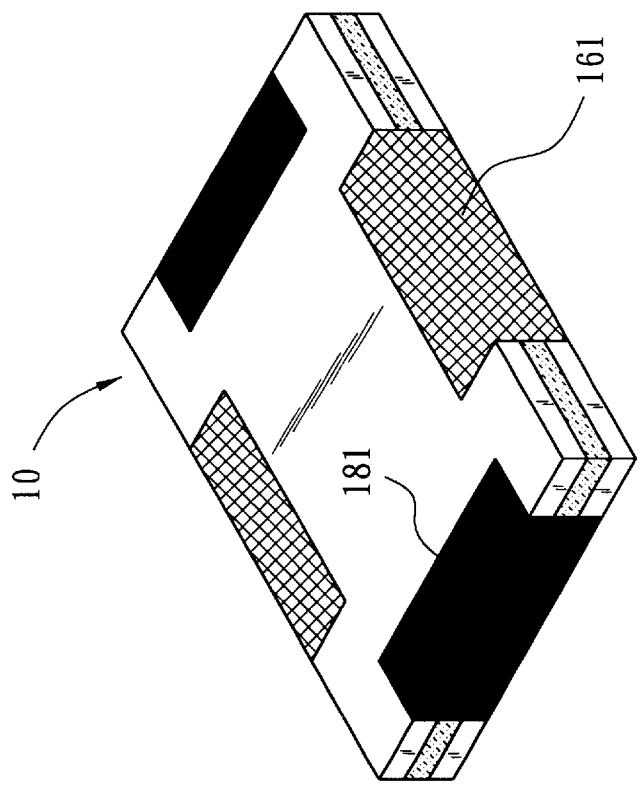
Figure 9D:
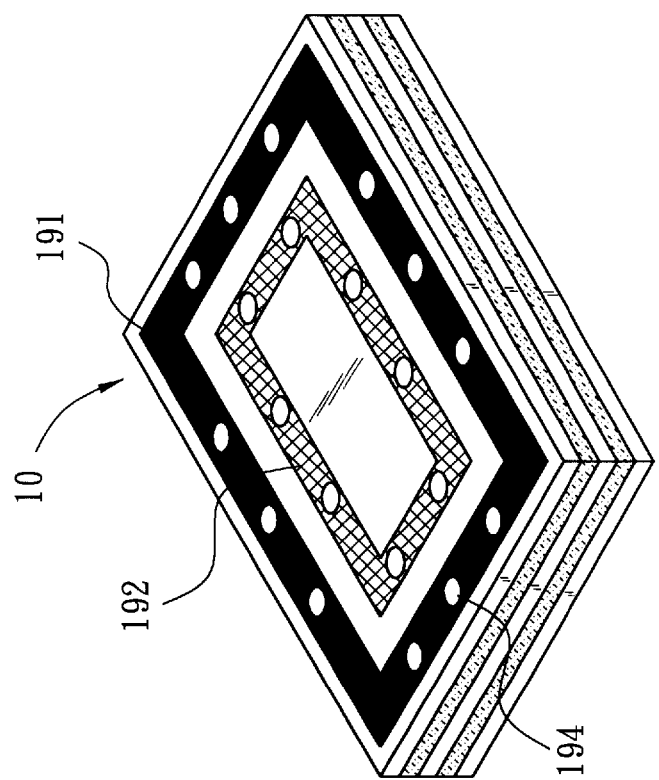
Figure 9C:
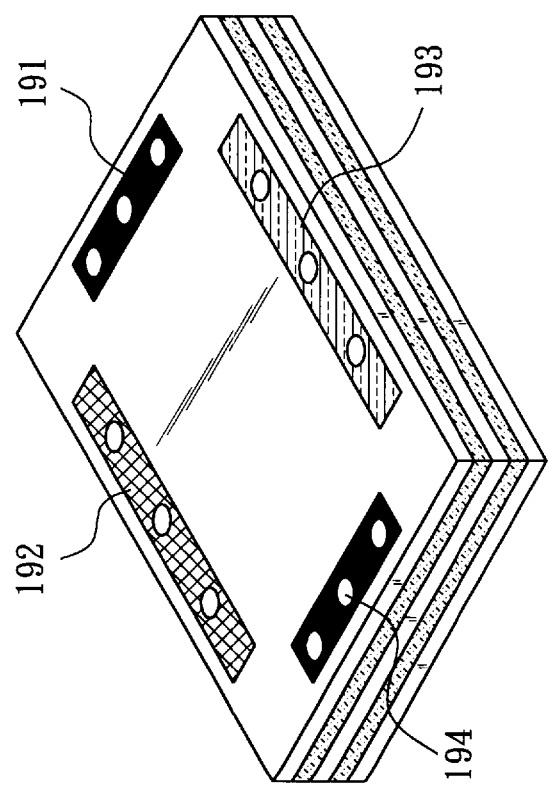

Please refer to FIGS. 9A and 9B for a second embodiment of the disclosed chip capacitor 10. The electrode layer can use I/O bonding pads 161, 181 with a sheet or frame shape. They are connected to the top surface through their side surfaces or using the via holes inside the I/O connect pad 194, as shown in FIGS. 9C and 9D. Of course, if the isolated I/O bonding pads are connected to different layers, then a multi-electrode layer design can be formed, e.g. the I/O bonding pads 191, 192, 193 in FIGS. 9C and 9D. The shape of the I/O bonding pads can also be any geometric pattern.

Effects of the Invention

This specification discloses a packaging structure with low switching noises. Several conductors are separated to form a chip capacitor that is directly connected to an IC chip. Such a chip capacitor can provide better noise filtering effects, effectively lowering switching noises. Since its size is close to the IC chip and both of them are stacked together, the chip capacitor does not occupy any extra area as the independent capacitors. Moreover, the chip capacitor can be designed to have I/O connect pads of the electrode layers disposed in an interposed array. Therefore, the invention can be applied to all kinds of IC chips.

While the invention has been described by way of example and in terms of the preferred embodiment, it is to be understood that the invention is not limited to the disclosed embodiments. To the contrary, it is intended to cover various modifications and similar arrangements as would be apparent to those skilled in the art. Therefore, the scope of the appended claims should be accorded the broadest interpretation so as to encompass all such modifications and similar arrangements.

What is claimed is:

1. A packaging structure with low switching noises, which comprises:

an IC chip, which has a plurality of bonding pads; and a chip capacitor connected to the IC chip and having a plurality of separated electrode layers, including a top layer, each of the electrode layers having at least one I/O connect pad connecting to said top layer, said connect pad including both a bonding pad on said top layer and a through hole and the chip capacitor being attached to the top or bottom surface of the IC chip.

2. The packaging structure of claim 1, wherein the electrode layers of the chip capacitor is made of conductors.

3. The packaging structure of claim 1, wherein electrode layers of the chip capacitor are separated by high dielectric constant materials.

4. The packaging structure of claim 1, wherein the electrode layers of the chip capacitor include at least a power layer and a ground layer.

5. The packaging structure of claim 1, wherein the I/O connect pad of the chip capacitor is an I/O bonding pad.

6. The packaging structure of claim 5, wherein the I/O bonding pads of the chip capacitor are disposed in an array.

7. The packaging structure of claim 5, wherein the I/O bonding pads of the different electrode layers are interposed.

8. The packaging structure of claim 1, wherein the I/O connect pads of the different electrode layers are separated.

9. The packaging structure of claim 8, wherein the I/O connect pad is around the border of the chip capacitor.

10. The packaging structure of claim 1, wherein the IC chip and the chip capacitor are connected together and then attached together to a substrate.

11. The packaging structure of claim 10, wherein the IC chip and the chip capacitor are connected together and one side of the IC chip is connected to the substrate.

12. The packaging structure of claim 10, wherein the IC chip and the chip capacitor are connected together and one side of the chip capacitor is connected to the substrate.

13. The packaging structure of claim 10, wherein the IC chip and the chip capacitor are connected together and then attached to a cavity of the substrate.

14. The packaging structure of claim 1, wherein the chip capacitor is connected to a substrate.

15. The packaging structure of claim 14, wherein the chip capacitor is directly formed on the substrate using the thin film manufacturing process.

16. The packaging structure of claim 14, wherein the chip capacitor is directly formed on the substrate using the thick film manufacturing process.

17. The packaging structure of claim 14, wherein the chip capacitor is connected to the IC chip and the substrate using the synchronous bumping assembly technique.

18. The packaging structure of claim 14, wherein the chip capacitor is connected to the IC chip and the substrate using the synchronous through-type bumping assembly technique.

19. A packaging structure with low switching noises, which comprises:

an IC chip, which has a plurality of bonding pads; and a chip capacitor connected to the IC chip and having a plurality of separated electrode layers, each of the electrode layers having at least one I/O connect pad connecting to a top layer, and the chip capacitor being attached to the top or bottom surface of the IC chip wherein the chip capacitor is directly used as an IC substrate of the IC chip.

20. A packaging structure with low switching noises, which comprises:

an IC chip, which has a plurality of bonding pads; and a chip capacitor connected to the IC chip and having a plurality of separated electrode layers, each of the electrode layers having at least one I/O connect pad connecting to a top layer, and the chip capacitor being attached to the top or bottom surface of the IC chip wherein the chip capacitor is embedded into a substrate.

* * * * *